US008480186B2

(12) United States Patent
Wang

(10) Patent No.: US 8,480,186 B2
(45) Date of Patent: Jul. 9, 2013

(54) SHELL ASSEMBLING DEVICE AND SHELL HAVING THE SAME

(75) Inventor: Guangcheng Wang, Shenzhen (CN)

(73) Assignee: BYD Company Limited, Shenzhen, Guangdong (CN)

( * ) Notice: Subject to any disclaimer, the term of this patent is extended or adjusted under 35 U.S.C. 154(b) by 0 days.

(21) Appl. No.: 13/282,628

(22) Filed: Oct. 27, 2011

(65) Prior Publication Data

US 2012/0043867 A1 Feb. 23, 2012

Related U.S. Application Data

(63) Continuation of application No. PCT/CN2010/072217, filed on Apr. 26, 2010.

(30) Foreign Application Priority Data

Apr. 30, 2009 (CN) ...................... 2009 2 0131262 U

(51) Int. Cl.
*A47B 81/00* (2006.01)
(52) U.S. Cl.
USPC ...................................... 312/223.1
(58) Field of Classification Search
USPC ......... 312/223.1, 223.2, 223.4, 140; 403/291, 403/220
See application file for complete search history.

(56) References Cited

U.S. PATENT DOCUMENTS

| | | | | |
|---|---|---|---|---|
| 4,759,466 A | * | 7/1988 | Chase et al. | 312/223.2 |
| 5,613,237 A | * | 3/1997 | Bent et al. | 361/814 |
| 5,931,514 A | * | 8/1999 | Chung | 292/89 |
| 6,326,543 B1 | * | 12/2001 | Lamp et al. | 174/546 |
| 6,375,283 B1 | * | 4/2002 | Kitamura et al. | 312/223.1 |
| 6,808,239 B1 | * | 10/2004 | Bader | 312/265.5 |
| 6,876,543 B2 | * | 4/2005 | Mockridge et al. | 361/814 |
| 7,429,700 B2 | * | 9/2008 | Kanamaru et al. | 174/50 |
| 7,550,226 B2 | * | 6/2009 | Qin et al. | 429/100 |
| 7,964,808 B2 | * | 6/2011 | Seo et al. | 200/5 R |
| 7,995,355 B2 | * | 8/2011 | Cochrane | 361/818 |
| 8,020,901 B2 | * | 9/2011 | Watanabe | 312/223.2 |
| 2008/0020813 A1 | | 1/2008 | Choi et al. | |

FOREIGN PATENT DOCUMENTS

| | | |
|---|---|---|
| CN | 2750622 | 1/2006 |
| CN | 1825665 | 8/2006 |
| CN | 2874594 | 2/2007 |

OTHER PUBLICATIONS

International Search Report mailed Jul. 15, 2010, for related PCT Patent Application No. PCT/CN2010/072217.
International Preliminary Report on Patentability issued Nov. 1, 2011, for related PCT Patent Application No. PCT/CN2010/072217.

* cited by examiner

*Primary Examiner* — Hanh V Tran
(74) *Attorney, Agent, or Firm* — Finnegan, Henderson, Farabow, Garrett & Dunner, LLP

(57) ABSTRACT

A shell assembling device for assembling a shell having a first cover and a second cover is provided, the shell assembling device comprising: a plurality of rigid fitting structures provided on the first cover and second cover, and a plurality of elastic interference fitting structures provided on the first cover and second cover.

11 Claims, 6 Drawing Sheets

SHELL ASSEMBLING DEVICE AND SHELL HAVING THE SAME

CROSS-REFERENCE TO RELATED APPLICATIONS

The present application is a continuation of International Application No. PCT/CN2010/072217, filed Apr. 26, 2010, designating the United States of America, which claims priority to Chinese Patent Application No. 200920131262.6 filed with SIPO on Apr. 30, 2009, the entirety of both of which are hereby incorporated by reference.

FIELD OF THE INVENTION

The present invention generally relates to a shell assembling device and a shell having the assembling device.

BACKGROUND

With the large-scale popularization of all kinds of electric products, the requirements for the appearance of the electronic products have become higher and higher. Particularly, the concept of seamless connection has become an important reference for the appearance quality of the electronic products. On one hand, it is advantageous to reduce the assembly clearance of the electronic product shells so as to prevent dust from entering the electronic products; on the other hand, smaller clearance means that the electronic products appear fine and of high quality to consumers, and thus has become an important factor for consumers to select electronic products.

Nevertheless, because of the existence of tolerance, clearance of the shell is inevitable. Especially in the production process, stricter control of the tolerance means higher cost. Therefore, it is necessary to provide a shell assembling device that reduces the clearance of the shell and is economical for manufacture.

SUMMARY OF THE INVENTION

The present invention is directed to solve at least one of the problems in the art.

Accordingly, the present disclosure provides a shell assembling device that reduces assembly clearance.

According to the present disclosure, a shell assembling device for assembling a shell having a first cover and a second cover comprises: a plurality of rigid fitting structures provided on the first cover and the second cover, and a plurality of elastic interference fitting structures provided on the first cover and the second cover.

The present disclosure further provides a shell comprising a first cover; a second cover; and the assembling device mentioned above provided on the first cover and the second cover for fitting the first cover and the second cover.

By using the elastic interference fitting structure and the rigid fitting structure simultaneously to assemble the shell, the disadvantageous effects of tolerance may be eliminated, and the assembly clearance between the first cover and the second cover may be reduced.

DETAILED DESCRIPTION OF THE EMBODIMENTS

These and other aspects, solutions and advantages of the invention will become apparent and more readily appreciated from the following descriptions taken in conjunction with the drawings, and the embodiments should be considered as an explanation instead of limitation to the invention.

Figure 1:
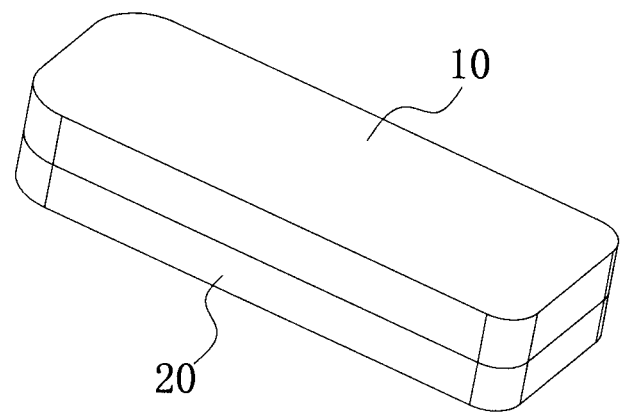
FIG. 1 is a perspective view of a shell according to an embodiment of the present disclosure.
Figure 2:
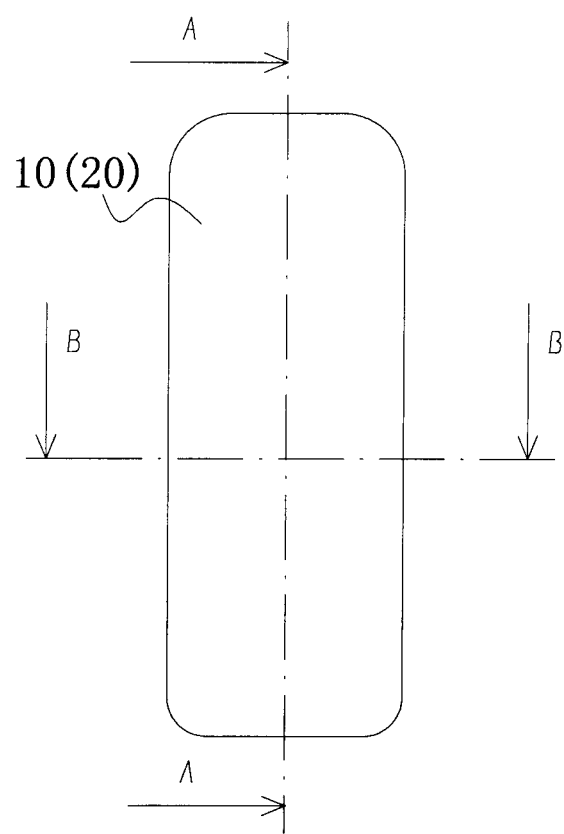
FIG. 2 is a front view of the shell in FIG. 1.
Figure 3:
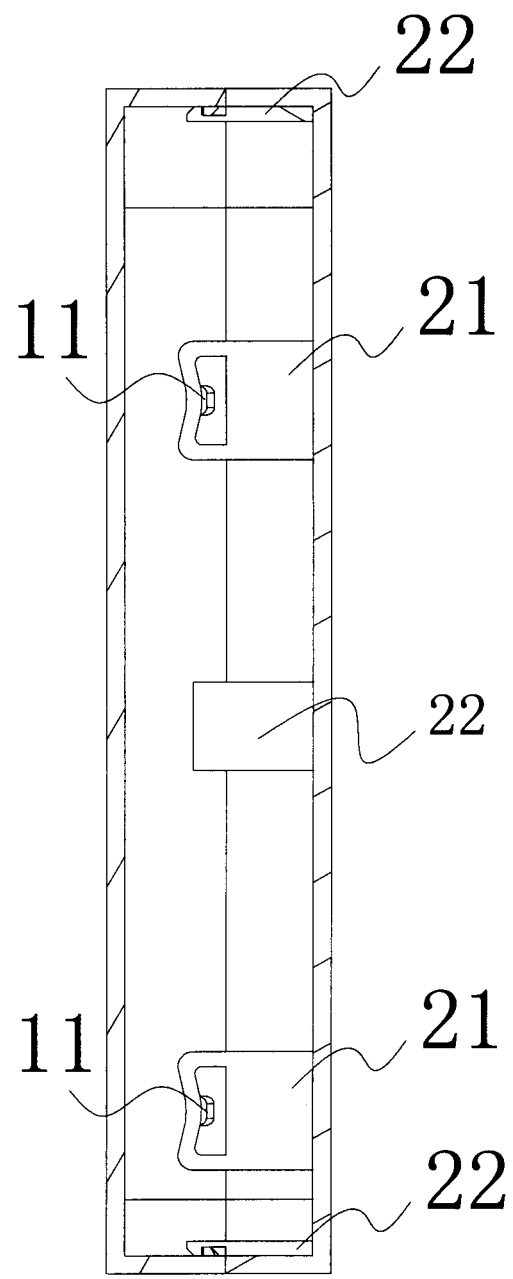
FIG. 3 is a cross section view of the shell along line A-A in FIG. 2.
Figure 4:
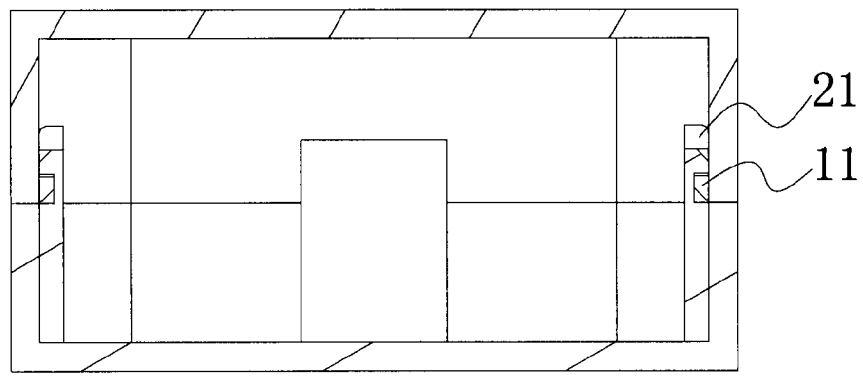
FIG. 4 is a cross section view of the shell along line B-B in FIG. 2.
Figure 5:
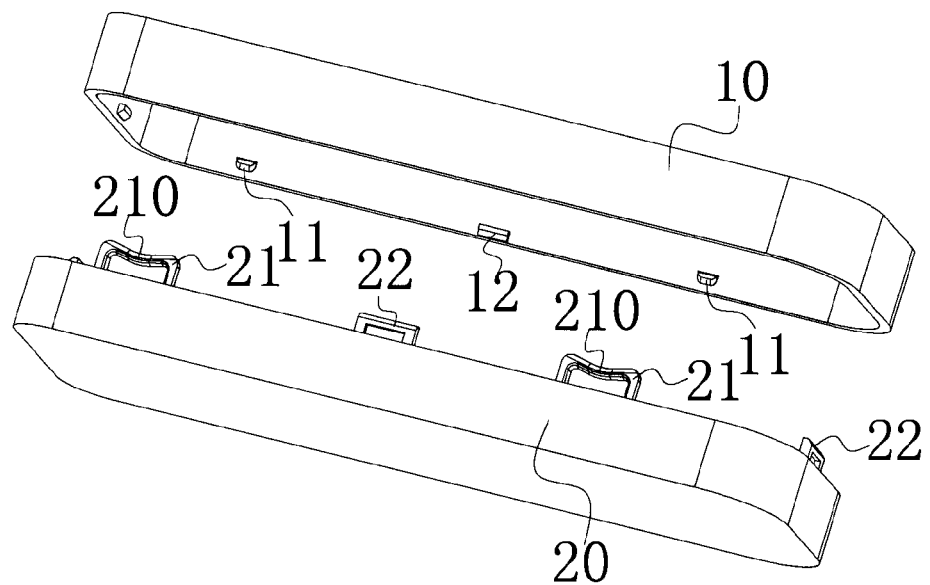
FIG. 5 is an exploded perspective view of the shell in FIG. 1.
Figure 6:
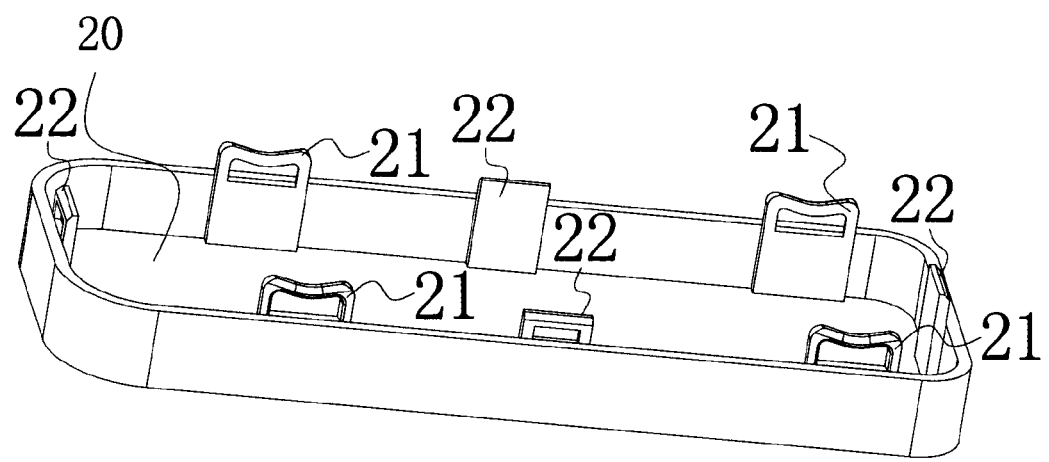
FIG. 6 is a perspective view of the second cover of the shell in FIG. 1.

FIG. 1 to FIG. 6 shows a shell assembling device according to a first embodiment of the disclosure. The shell assembling device is used to assemble a first cover 10 and a second cover 20 so as to form a shell. The shell assembling device comprises a plurality of rigid fitting structures mounted on the first cover 10 and the second cover 20, and a plurality of elastic interference fitting structure mounted on the first cover 10 and the second cover 20.

In some embodiments, the rigid fitting structure is a rigid snap-in fitting structure, and comprises a rigid female button 22 disposed on the second cover 20 and a male boss 12 disposed on the first cover 10 and adapted to be snapped in the rigid female button 22. During the assembly of the shell, the male boss 12 may be clipped in the rigid female button 22 and can't move therein.

In other embodiments, the rigid fitting structure may include a screw or other rigid fitting structures.

The elastic interference fitting structure is of a snap-in type and comprises an elastic female button 21 mounted on the second cover 20, the elastic female button 21 having an elastic arm 210, and a male tongue 11 mounted on the first cover 10 and adapted to be snapped in the elastic female button 21. After the first cover 10 is assembled with the second cover 20 to form the shell, the male tongue 11 may be clipped in the elastic female button 21 with interference fitting in between. The elastic arm 210 deforms to impose an elastic force on the male tongue 11, so that the fitting between the first cover 10 and the second cover 20 is tight and the assembly clearance between the first and second covers is reduced. The shell assembling device may solve the problems caused by only using the rigid fitting structure via adding the elastic interference fitting structure, and it is more economical. Because of the rigid fitting structure, it is difficult for users to feel the existence of the elastic interference fitting structure between the first and second covers. In some embodiments, a plurality of male tongues 11 and male bosses 12 are provided in an alternating manner on the first cover 10, and correspondingly a plurality of elastic female buttons 21 and rigid female buttons 22 are provided in an alternating manner on the second cover 20.

Figure 7:
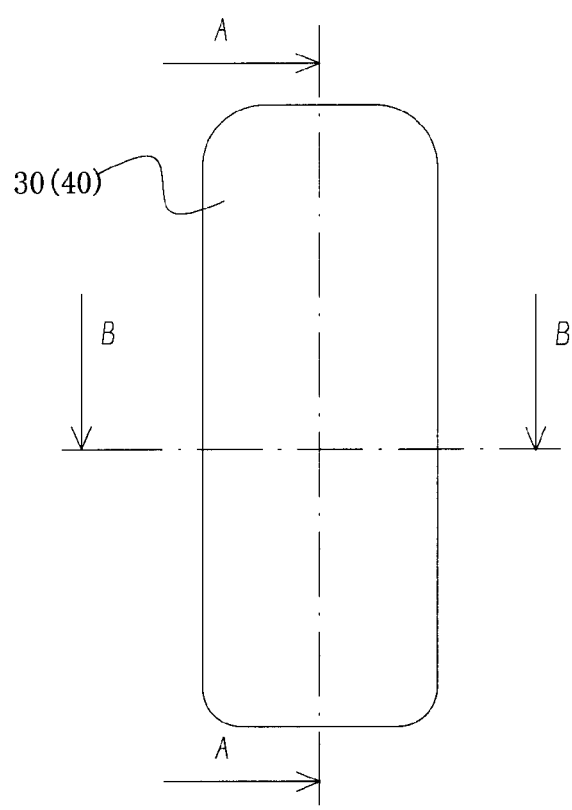
FIG. 7 is a front view of the shell according to another embodiment of the present disclosure.
Figure 8:
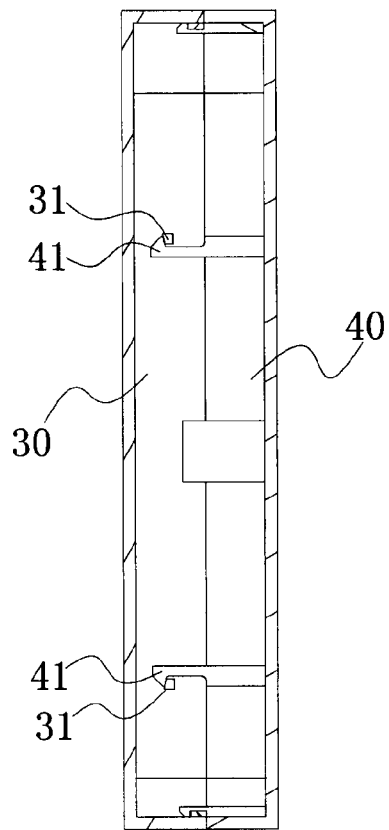
FIG. 8 is a cross section view of the shell along line A-A in FIG. 7.
Figure 9:
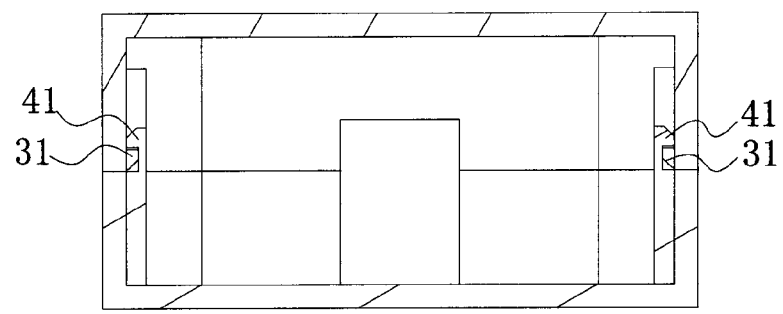
FIG. 9 is a cross section view of the shell along line B-B in FIG. 7.
Figure 10:
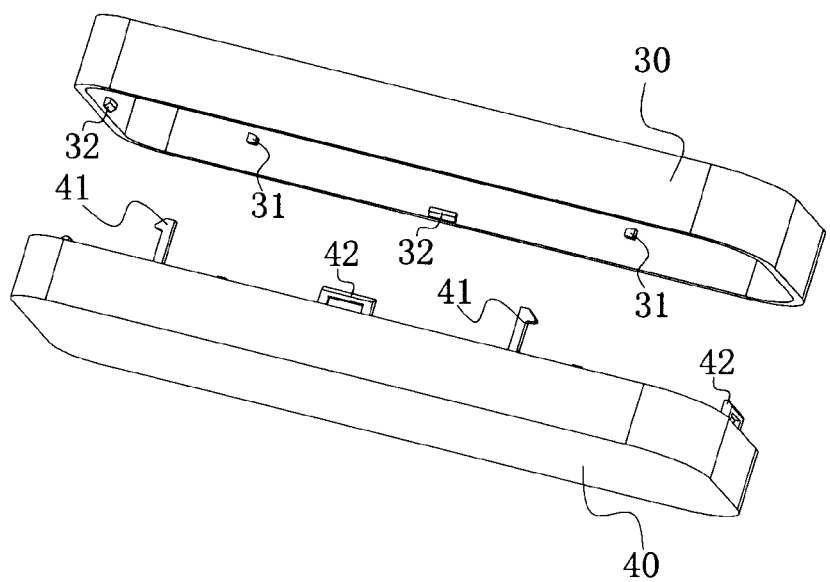
FIG. 10 is an exploded perspective view of the shell in FIG. 7.
Figure 11:
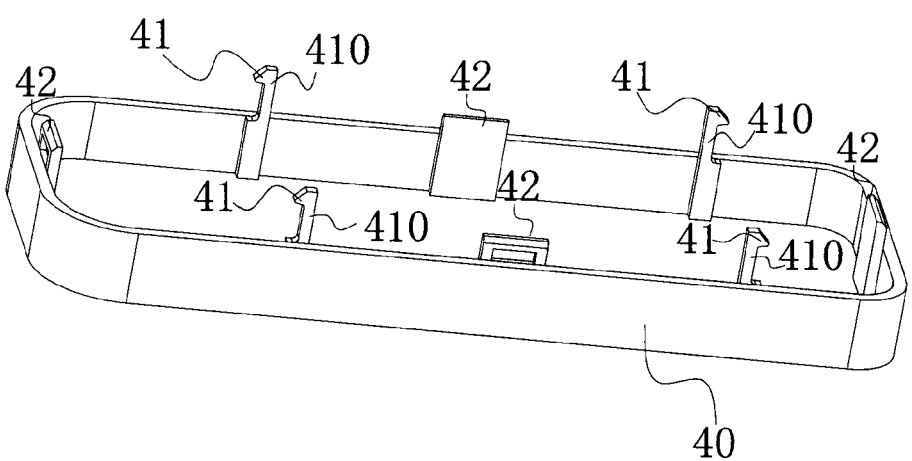
FIG. 11 is a perspective view of the second cover of the shell in FIG. 7.

FIG. 7 to FIG. 11 shows a shell assembling device according to a second embodiment of the disclosure. According to the second embodiment, a plurality of rigid fitting structures comprises a rigid female button 42 disposed on a second cover 40 and a male boss 32 disposed on a first cover 30. During the assembly of a shell comprising the first cover 30 and the second cover 40, the male boss 32 may be clipped in the rigid female button 42 and can't move therein. The shell assembling device further comprises a plurality of elastic interference fitting structures comprising a male tongue 31 disposed on the first cover 30 and an elastic hook 41 disposed on the second cover 40. During the assembly of the shell, the male boss 31 may be caught by the elastic hook 41 with interference fitting in between. After assembling, an elastic connecting arm 410 on the elastic hook 41 imposes an elastic force on the male boss 31, so that the fitting between the first cover 30 and the second cover 40 is tight and the assembly clearance between the two covers is reduced. The shell assembling device may solve the problems caused by only using the rigid fitting structure via adding the elastic interference fitting structure, and it is more economical. Because of the rigid fitting structure, it is difficult for users to feel the existence of the elastic interference fitting structure between the first and second covers.

As shown in FIG. 1 to FIG. 11, a shell according to an embodiment is provided, which comprises a first cover, a second cover, and an assembling device provided on the first and second covers for fitting the first cover and second cover. The assembling device may be any one described in the above two embodiments. The elastic interference fitting structure may solve the clearance problems due to the tolerance caused by only using the rigid fitting structure, and it is more economical. Because of the rigid fitting structure, it is difficult for users to feel the existence of the elastic interference fitting structure between the first and second covers.

Although explanatory embodiments have been shown and described, it would be appreciated by those skilled in the art that changes, alternatives, and modifications can be made in the embodiments without departing from spirit and principles of the invention. Such changes, alternatives, and modifications all fall into the scope of the claims and their equivalents.

What is claimed is:

1. A shell comprising
a first cover and a second cover, and
a shell assembling device comprising: a plurality of rigid fitting structures provided on the first cover and the second cover, and a plurality of elastic interference fitting structures provided on the first cover and the second cover, wherein the rigid fitting structure comprises a rigid snap-in fitting structure,
wherein each elastic interference fitting structure includes an elastic structure on one of the first cover and the second cover and a protrusion on the other of the first cover and the second cover, and
wherein the elastic structure comprises a curved middle portion, such that when the first cover and the second cover are assembled, the elastic structure deforms to fit with the protrusion and impose an elastic force on the protrusion, and the elastic structure remains deformed to impose an interference fitting between the elastic structure and the protrusion after the first cover and the second cover are assembled.

2. The shell of claim 1, wherein the rigid fitting structures and the elastic interference fitting structures are provided in an alternating manner.

3. The shell of claim 1, wherein the elastic interference fitting structure is of a snap-in type.

4. The shell of claim 1, wherein the rigid fitting structure comprises a rigid female button disposed on the second cover and a male boss disposed on the first cover and adapted to be snapped in the rigid female button.

5. The shell of claim 2, wherein the rigid fitting structure comprises a rigid female button disposed on the second cover and a male boss disposed on the first cover and adapted to be snapped in the rigid female button.

6. The shell of claim 3, wherein the rigid fitting structure comprises a rigid female button disposed on the second cover and a male boss disposed on the first cover and adapted to be snapped in the rigid female button.

7. A shell, comprising:
a first cover;
a second cover; and
an assembling device for fitting the first cover and the second cover, wherein the assembling device comprises: a plurality of rigid fitting structures provided on the first cover and the second cover, and a plurality of elastic interference fitting structures provided on the first cover and the second cover, wherein the rigid fitting structure comprises a rigid snap-in fitting structure,
wherein each elastic interference fitting structure includes an elastic structure on one of the first cover and the second cover and a protrusion on the other of the first cover and the second cover, and
wherein the elastic structure comprises a curved middle portion, such that when the first cover and the second cover are assembled, the elastic structure deforms to fit with the protrusion and impose an elastic force on the protrusion, and the elastic structure remains deformed to impose an interference fitting between the elastic structure and the protrusion after the first cover and the second cover are assembled.

8. The shell of claim 7, wherein the rigid fitting structures and the elastic interference fitting structures are provided in an alternating manner.

9. The shell of claim 7, wherein the elastic interference fitting structure is of a snap-in type.

10. The shell of claim 7, wherein the rigid fitting structure comprises a rigid female button disposed on the second cover and a male boss disposed on the first cover and adapted to be snapped in the rigid female button.

11. The shell of claim 8, wherein the rigid fitting structure comprises a rigid female button disposed on the second cover and a male boss disposed on the first cover and adapted to be snapped in the rigid female button.

* * * * *